United States Patent

Sirot et al.

[11] 4,124,417
[45] Nov. 7, 1978

[54] METHOD OF DIFFUSING IMPURITIES IN SEMICONDUCTOR BODIES

[75] Inventors: Norbert Sirot, Herouville St Clair; Robert Thevenon, Ste Honorine du Faye, both of France

[73] Assignee: U.S. Philips Corporation, New York, N.Y.

[21] Appl. No.: 801,925

[22] Filed: May 31, 1977

Related U.S. Application Data

[63] Continuation of Ser. No. 613,623, Sep. 15, 1975, abandoned.

[30] Foreign Application Priority Data

Sep. 16, 1974 [FR] France ............................... 74 31243

[51] Int. Cl.² .......................................... H01L 21/223
[52] U.S. Cl. .................................... 148/189; 148/186

[58] Field of Search ................. 148/189, 187, 186, 1.5

[56] References Cited

U.S. PATENT DOCUMENTS

| 3,131,099 | 4/1964 | Constantakes | 148/189 |
| 3,573,116 | 3/1971 | Cohen | 148/189 X |
| 3,764,414 | 10/1973 | Blum et al. | 148/189 |

Primary Examiner—G. Ozaki
Attorney, Agent, or Firm—Frank R. Trifari

[57] ABSTRACT

A method of diffusing doping impurities in semiconductor bodies by the transfer in the vapor phase from a source in a condensed form.

The diffusion space is of the "half-open type" and a cold point is maintained in it at the end opposite to the location of the source which is placed near a restricted passage to the atmosphere surrounding the space.

6 Claims, 2 Drawing Figures

METHOD OF DIFFUSING IMPURITIES IN SEMICONDUCTOR BODIES

This is a continuation of application Ser. No. 613,623, filed Sept. 15, 1975, now abandoned.

The present invention relates to a method of diffusing doping impurities in semiconductor bodies by the transfer of the impurites in the vapor phase from a source of impurities in a condensed form, in a space which has a controlled atmosphere and is exposed to the thermal rays of a furnace and at one end has a restricted passage for the communication with the ambient atmosphere.

Among the various known methods of diffusing impurities in semiconductor bodies are those in which an open tube is used, according to which methods a current of gas containing the impurities in the vapour phase is led over the bodies in the tube and simply flows through the tube, and methods in which a closed vessel is used according to which methods the semiconductor bodies with a source of impurities in a condensed form are placed in a closed space which is brought at a temperature at which the source evaporates and the impurity diffuses in the bodies.

For plates of semiconductor material, for example the III-V compounds, comprising the elements from groups III and V of the periodic table of elements of which the dissociation pressures at the treatment temperatures are often important, a diffusion method has been suggested in a semi-closed space which has a leakage possibility via a passage having a calibrated cross-section and a given length which enables the partial pressure in the space to be restricted.

Such method is described in French Pat. No. 2,161,798 which was filed on Nov. 30, 1971 in the name of applicants under the title "Method of and device for vapour phase diffusion", same issuing Sept. 16, 1974.

This method makes it possible to obtain in the device the required doping concentration profiles in good conditions as regards reliability, purity and safety. In the series manufacture of devices at minimum costs it is favourable to perform the diffusion treatments in a minimum of time and, for example, to avoid slow cooling, to reduce the time of diffusion and purifying the space, and to simplify the method of making the materials and in particular the doping sources.

However, the rapid cooling causes condensation and alloys at the surface of the plates, while the short diffusion times necessitate an increase of the diffusion temperature, which involves a surface degradation of the devices and an increase of the condensation phenomena; moreover, the sources used are complex and their preparation is often difficult.

One of the objects of the present invention is to mitigate the above-mentioned drawbacks and to provide an improvement of the known methods of diffusing in a semi-closed space.

Another object of the invention is to enable the diffusion of doping impurities in plates of semiconductor material of the III-V type of compounds in the best possible conditions as regards reliability and in particular for a cheap series production.

Still another object of the invention is to obtain diffused plates having a good surface state without the danger of degradation of the material.

According to the invention, the present method involves diffusing doping impurities in semiconductor bodies by the transfer in the vapor phase from a source of impurities in a condensed form, in a space which has a controlled atmosphere and is exposed to the thermal rays of a furnace and at one end has a restricted passage for the connection to the ambient atmosphere. The source is placed near the passage, the space which also comprises the semiconductor bodies is cleaned by means of a flow of gas which penetrates via the end opposite to the passage, after which, after closing the space with the exception of the said passage, the source is brought to its evaporation temperature and the bodies are brought to the diffusion temperature. A cold point is maintained in the space near the end opposite to the passage. Thereafter, after a certain diffusion time, the space is opened on the side of the source to remove the latter and the space is then cleaned by means of a flow of gas, after which the temperature of the bodies is decreased.

Since the flow of gas for cleaning the space penetrates via the end which is present opposite to the passage, the space is cleaned entirely and rapidly, including the semiconductor bodies which are placed in it.

The cold point which consists of a region of the space which is maintained at a lower temperature than all the other regions of the space causes a transport of the vapors which are formed by the evaporation of the source in the direction of the said cold point where they tend to condense again. The vapors containing the impurities to be diffused thus contact the exposed surfaces of the semi-conductor bodies which are present between the passage and the cold point.

The source is removed from the space immediately after the diffusion time has elapsed and any production of doping vapors in the space is discontinued from that instant on. The source is then preferably placed in a cold zone of a chamber in which there prevails an atmosphere which surrounds the vessel. Furthermore, the cleaning of the space, which is carried out immediately, causes any trace of doping vapors to disappear. In this manner any cause for condensation at the surface of the semiconductor bodies is removed. Since the flow of cleaning gas is introduced from the end of the space which is opposite to the open side, the cleaning is efficient and doping vapors can immediately be driven out.

Since the possibility of condensation at the semiconductor body is removed, it is possible to perform a rapid cooling of the semiconductor bodies and in addition it is useless to provide preferential centers for the recondensation as they can be formed by a powder of a suitable material, which powder is usually used to absorb the vapors as well as possible, alloys of which vapors are formed on the semiconductor bodies by condensation and a poor surface state is caused.

Since the possibility of condensation is substantially removed, it is possible to perform the diffusion at a comparatively high doping vapor partial pressure by using a source of doping element in the pure state and not an alloy or a complex mixture as is usually used to reduce the partial pressure of the doping vapor. Because the pressure of the doping vapor is higher, the diffusion times are correspondingly reduced to obtain the same diffusion depth. Decreased diffusion temperature, which can hardly be considered when the diffusion time is already long as a result of a lower partial pressure, on the contrary may be used in this case with the comparatively high vapor pressure.

The diffusion temperature is preferably decreased to a minimum value below the threshold corresponding, in the case of a compound, with a congruent evaporation of the material of the semiconductor bodies in the volume and pressure conditions of the diffusion device used. Any possibility of deterioration of the surface of the semiconductor bodies as a result of evaporation of the composing elements is thus removed.

The atmosphere surrounding the diffusion space is preferably that of a continuously refreshed neutral gas at a pressure which is near that of the atmosphere. Due to a restricted passage for the connection between the space and the atmosphere, a constant partial pressure of a neutral gas is maintained in the space and said pressure contributes to the decrease and the control of the supply of the doping vapours above the semiconductor bodies.

It is also desirable for the cold point in the space to be present as close as possible to the supply of the cleaning gas so that the vapors of the doping product which are dragged along by the flow of cleaning gas cannot condense on the walls and on the surface which they meet. The space is preferably tubular and its end present opposite to the passage, continues in a supply duct for cleaning gas which is closed by a valve. The space is placed in a tunnel furnace, the end of the duct always remaining outside the furnace and thus constituting the cold point of the space.

In order to open the space and rapidly remove the source therefrom, there is used a device of the type described in the above-mentioned French Patent and comprising two tubes which are closed at one end and one of which can be introduced into the other with a certain amount of play which thus forms the passage.

The inner tube comprises the doping source and by removing the inner tube from the outer tube, the space is opened and simultaneously the source is removed.

The conditions for the rise in temperature of the semiconductor bodies and of the source and the conditions of the cooling depend on the furnace used. One of the preferred methods consists of providing a tubular furnace having a substantially constant, controlled temperature, through which furnace extends a likewise tubular chamber in which a flow of neutral gas is maintained. The temperature variations of the space are obtained by displacing the latter between a heated part of the chamber and a non-heated part outside the furnace.

The invention may be used for the diffusion treatments in plates of semiconductor material, in particular in the semiconductor materials of the III-V type. The invention enables especially the performance in the best possible conditions of the diffusion of zinc in gallium arsenide phosphide, gallium phosphide, or gallium arsenide.

The invention will now be described in greater detail with reference to the accompanying drawings.

Figure 1:
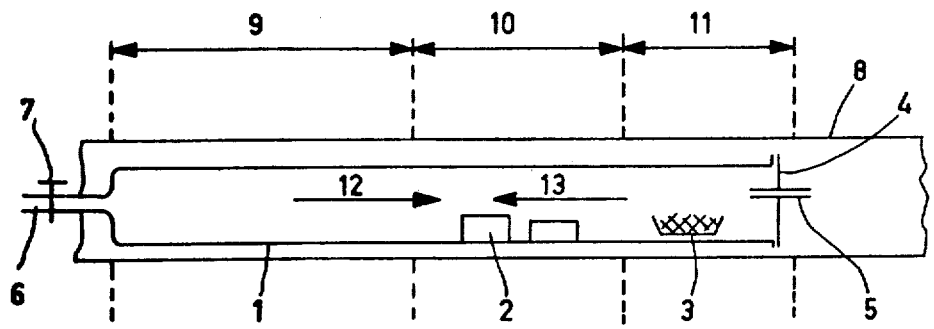
FIG. 1 is a diagrammatic longitudinal sectional view of a device for carrying out the method according to the invention.

Referring to FIG. 1 the device of the invention comprises a vessel 1 containing a diffusion space and having at one end a cover 4 which comprises a passage 5 for the communication with the ambient atmosphere. The vessel 1 is present in a chamber 8. The vessel 1 comprises at its other end an inlet 6 for a neutral gas which is operated by a valve 7 and comprises a source of doping impurities 3 and a semiconductor bodies 2. The space is exposed to the thermal rays of a furnace which is designed to form in the space a zone 11 for heating the source 3 to the evaporation temperature, a zone 10 for heating the bodies 2 to the diffusion temperature and a zone 9 which is maintained at a low temperature.

The semiconductor bodies 2 and the source 3 are placed in the space of the vessel 1 at room temperature and a flow of cleaning gas, which is passed through the inlet 6 cleans the space in the direction of the arrow 12 and escapes through the passage 5.

It is also possible to clean the space 1 before providing it with the cover 4, in which case the latter is provided after cleaning. The valve 7 is then closed, the atmosphere maintained in the chamber 8 being a protective gas under a pressure which is near that of the atmosphere, preferably the same gas as the cleaning gas at 6.

The semiconductor bodies 2 are heated at the diffusion temperature and the source is heated at the evaporation temperature by radiation of the heating zones 10 and 11, the zone 9 being maintained at a temperature which is near room temperature. The doping vapors thus produced tend to orient towards the cold point of the space at the level of the zone 9 in the direction of the arrow 13.

When the necessary diffusion time has elapsed, the cover 4 is removed, the source 3 is removed from the vessel 1 and a flow of cleaning gas is introduced by opening the valve 7. The removal of the source 3 has prevented any new production of doping vapors in the space.

After the cleaning treatment which removes the possible residues of doping vapors and hence prevents any possibility of condensation on the semiconductor bodies 2, said bodies are brought at a comparatively low temperature so as to be able to remove them from the space.

Figure 2:
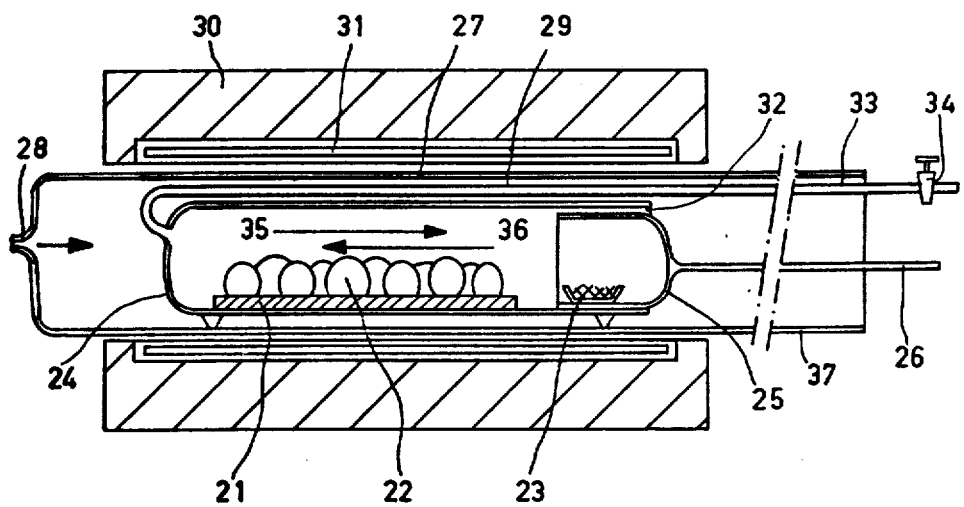
FIG. 2 is a diagrammatic more detailed longitudinal sectional view of another device for carrying out the method according to the invention.

In FIG. 2, the semiconductor plates 22 are arranged vertically on a platform 21 which is placed in a tubular vessel 24. The vessel 24 is open at one end and an inner tube 25 having an operating rod 26 is inserted. The outside diameter of the inner tube 25 is only slightly smaller than the inner diameter of the vessel 24. The play between the inner tube and the vessel thus constitutes a narrow passage 32 from the space defined by the vessel 24 and inner tube 25 to the ambient atmosphere. At the end of the vessel 24 opposite the open end thereof, a duct 29 having a large diameter debouches and terminates in a valve 34. The vessel 24 can be moved within a tubular chamber 27 which has an inlet 28 for the protective gas 28. The chamber 27 traverses a tunnel furnace 30 in which the heating element 31 is provided, so as to heat the plate 22 and the source 23 at the diffusion and evaporation temperatures, which in the embodiment described are equal. A part 37 of the chamber 27, which is longer than the vessel 24 remains outside the furnace 30. The vessel 24 is filled, then placed in the part 37, the oven 30 being maintained at temperature. A flow of neutral gas is led into the duct 29 and the space is cleaned, the cleaning gas flowing in the direction of the arrow 35 and escaping via the passage 32. The valve 34 is then closed and the vessel 24 containing the plates 22 and the source 23 is pushed in the direction of the heating zone of the furnace 30, the protective atmosphere being maintained in the chamber 27.

The doping vapors produced by the source 23 are conveyed to the plates 22 in the direction of the arrow 36 and the excess of said vapors starts to condense in the part 33 of the duct 29 which is present outside the heating zone at a low temperature. This part 33 of the duct 29 serves as a cold point. In order to facilitate the operation, the duct 29, 33 is bent and guided to the operating side of the vessel 24.

After the diffusion time the inner tube 25 is drawn outside the heated zone and guided into the cold part 37 of the chamber 27. The valve 34 is opened and a flow of neutral gas is conveyed through the duct 29 into the vessel 24 which is cleaned in the direction of the arrow 35. The remaining doping vapors are immediately removed. The vessel 24 with the plates 22 or only the platform 21 supporting the plates 22 is moved to the cold part 37 of the chamber 27, which causes a rapid cooling of the plates.

The method described above with reference to FIG. 2 may be used, for example, for diffusing zinc in plates of gallium arsenide phosphide with, for example 30 plates each having an area of 20 cm$^2$ and a thickness of 400$\mu$ being treated simultaneously. The tubular vessel 24 has an inside diameter of 75 mm and a length of 50 cm. The inner tube 25 for closing the vessel 24 has an outside diameter of 73 mm and the source 23 comprising a vessel containing pure zinc is placed in it. The cleaning of the space is carried out by means of a flow of pure nitrogen with a supply of 5 liters per minute for 30 minutes. The diffusion temperature is in the order of 650° to 750° C. and the diffusion lasts from 1 to 4 hours in accordance with the required characteristics. The evaporation temperature of zinc is the same as the diffusion temperature. The atmosphere of the chamber 27 which surrounds the vessel 24 consists of pure nitrogen under a pressure of approximately 1 bar.

The cleaning is carried out after the diffusion by means of a flow of pure nitrogen for 10 minutes with a supply of 10 liters per minute. The cooling of the plates is carried out by a displacement towards the cold zone of the furnace in approximately 3 minutes.

What is claimed is:

1. A method of diffusing doping impurities in semiconductor bodies by the transfer of said impurities in the vapor phase, comprising the steps of:
   (a) providing a vessel defining a space which has a controlled atmosphere and is exposed to the thermal rays of a furnace and comprises at one end thereof a restricted passage for communication with the ambient atmosphere, said vessel containing said semiconductor bodies,
   (b) placing a source of impurities in a condensed form in said vessel near said passage,
   (c) cleaning said space by means of gas which is introduced therein via the other end of said vessel thereof opposite to said passage,
   (d) then closing said space with the exception of said passage,
   (e) bringing said source to at least its evaporation temperature and transporting source vapor to said bodies,
   (f) heating said bodies at at least the diffusing temperature,
   (g) maintaining at least during said heating of said bodies a cold point in the space near said other end opposite to said passage,
   (h) then, after a certain diffusion time, opening said vessel at said one end to remove said source,
   (i) cleaning said space by means of a flow of gas, all of said gas flowing in the direction from said one end to said other end, and thereafter,
   (j) decreasing the temperature of said bodies.

2. A method as in claim 1, wherein said impurity source is a doping element in a substantially pure state.

3. A method as in claim 1, wherein said atmosphere surrounding said space is of a substantially pure continuously refreshed neutral gas driven under a pressure which is near atmospheric pressure.

4. A method as in claim 1, wherein said diffusion temperature is below the evaporation temperature of the material of said semiconductor body.

5. A method as in claim 1, wherein, after said steps of diffusion and cleaning of said space, said semiconductor bodies are reduced in temperature by rapid cooling.

6. A method as in claim 1, comprising the steps of disposing said vessel in a chamber that has a part thereof maintained at a low temperature and temperature variations of the diffusion space are obtained by displacing said vessel in said chamber.

* * * * *